US008594400B2

(12) United States Patent
Darrow et al.

(10) Patent No.: US 8,594,400 B2
(45) Date of Patent: Nov. 26, 2013

(54) SYSTEM AND METHOD FOR MR IMAGE SCAN AND ANALYSIS (75) Inventors: Robert David Darrow, Scotia, NY (US); Thomas Kwok-Fah Foo, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 879 days.

(21) Appl. No.: 12/713,745

(22) Filed: Feb. 26, 2010

(65) Prior Publication Data
US 2011/0211744 A1 Sep. 1, 2011

(51) Int. Cl.
*G06K 9/00* (2006.01)
(52) U.S. Cl.
USPC .......................................................... 382/128
(58) Field of Classification Search
USPC .......................................................... 382/128
See application file for complete search history.

(56) References Cited

U.S. PATENT DOCUMENTS

| | | | |
|---|---|---|---|
| 5,239,591 A | 8/1993 | Ranganath | |
| 6,195,409 B1 | 2/2001 | Chang et al. | |
| 6,249,693 B1 | 6/2001 | Cline et al. | |
| 6,961,454 B2 | 11/2005 | Jolly | |
| 6,963,768 B2 * | 11/2005 | Ho et al. | 600/415 |
| 7,280,862 B2 | 10/2007 | Gupta et al. | |
| 7,321,676 B2 | 1/2008 | Lavi et al. | |
| 2004/0167803 A1 * | 8/2004 | Ma et al. | 705/2 |
| 2005/0113664 A1 | 5/2005 | Stefani et al. | |
| 2006/0052690 A1 * | 3/2006 | Sirohey et al. | 600/420 |
| 2006/0239554 A1 | 10/2006 | Sun et al. | |
| 2007/0253609 A1 | 11/2007 | Aben | |
| 2008/0009709 A1 | 1/2008 | Guehring et al. | |
| 2008/0267509 A1 | 10/2008 | Springorum et al. | |
| 2008/0281205 A1 * | 11/2008 | Naghavi et al. | 600/458 |
| 2008/0309333 A1 * | 12/2008 | Stehning et al. | 324/307 |
| 2010/0189328 A1 * | 7/2010 | Boernert et al. | 382/131 |

FOREIGN PATENT DOCUMENTS

| | | |
|---|---|---|
| WO | 2005088520 A1 | 9/2005 |
| WO | 2008039388 | 4/2008 |
| WO | 20080146228 | 12/2008 |

OTHER PUBLICATIONS

Breeuwer et al., "Analysis of volumetric cardiac CT and MR image data," Medicamundi, vol. 47, No. 2, Aug. 2003, pp. 41-53.
Pednekar et al., "Automatic Computation of Left Ventricular Ejection Fraction from Spatiotemporal Information in Cine-SSFP Cardiac MR Images," Journal of Magnetic Resonance Imaging, vol. 28, 2008, pp. 39-50.
Lobregt et al., "A Discrete Dynamic Contour Model," IEEE Transactions on Medical Imaging, vol. 14, No. 1, Mar. 1995, pp. 12-24.

* cited by examiner

*Primary Examiner* — Gerald J. O'Connor
*Assistant Examiner* — Trang Nguyen
(74) *Attorney, Agent, or Firm* — Jenifer Haeckl (57) ABSTRACT

A system and method for an MRI apparatus includes an MRI system having a computer programmed to initiate a first scan procedure to acquire MR data and locate a feature of interest of the object, initiate a second scan procedure when a feature of interest of the object is located, and determine if an anomaly of the feature of interest exists. The computer is programmed to initiate a third scan procedure to scan the anomaly and reconstruct an image of the located anomaly if the anomaly exists. The first scan procedure includes a scan table motion and scan data acquisition commands. The second scan procedure includes scan table motion and scan data acquisition commands to acquire MR data from the feature of interest. The third scan procedure includes scan table motion and scan data acquisition commands to acquire MR data from the located anomaly.

20 Claims, 3 Drawing Sheets

SYSTEM AND METHOD FOR MR IMAGE SCAN AND ANALYSIS

BACKGROUND OF THE INVENTION

Embodiments of the invention relate generally to magnetic resonance (MR) imaging and, more particularly, to a system and method for MR image scan and analysis.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Conventional MR imaging typically follows a prescribe-ahead imaging model that outputs, for example, diagnostic images formed of different pixel intensities. In the prescribe-ahead model, one or more MR scanning protocols based on a desired imaging study are typically chosen and implemented by a technician. One or more images are then generated, and the technician or a doctor analyzes or "reads" the image(s) and determines if any anomalies are evident in the image(s) and also determines if further scanning is needed. If further scanning is needed, the technician and/or doctor determine if the same scanning protocol will be implemented and/or if one or more different scanning protocols will be implemented. Often, a technician and/or doctor undergoes several iterations of the scanning and reading procedure until a proper diagnosis can be made or until it is determined that no anomalies are present in the imaged region.

The "reading" of MR images and the prescription of scanning protocols, however, typically requires a special skill set and can often be a time consuming and costly process. Generally, a skilled technician and/or doctor is needed to undertake an MR study.

In a study where several different sections of the anatomy are scanned, such as in a whole-body screening study, the scan parameters need to be adjusted to fit the specific region of the body. For example, a scan for the head generally requires a different technique (and acquisition parameters) than that for the lower abdomen. Hence, the skilled technician and/or doctor generally needs to manually adjust for the type of scan, spatial coverage, and acquisition parameters or protocols for each region of the body. This can be a time-consuming process.

It would therefore be desirable to have a system and method capable of automatically analyzing MR images, where the analysis identifies a section of anatomy that is scanned.

BRIEF DESCRIPTION OF THE INVENTION

Embodiments of the invention provide a system and method of automatically analyzing MR images.

In accordance with an aspect of the invention, an MRI apparatus includes an MRI system having a plurality of gradient coils positioned about a bore of a magnet to impress a polarizing magnetic field. The MR apparatus also includes an RF transceiver system and an RF switch controlled by a pulse module to transmit and receive RF signals to and from an RF coil assembly to acquire MR images. The MRI apparatus also includes a computer programmed to initiate a first scan procedure to acquire MR data from an object and locate a feature of interest of the object, initiate a second scan procedure different than the first scan procedure when a feature of interest of the object is located, and determine if an anomaly of the feature of interest exists. If the anomaly exists, the computer is programmed to initiate a third scan procedure different than the first and second scan procedures to scan the anomaly and reconstruct an image of the located anomaly. The first scan procedure includes a first plurality of scan table motion commands and a first plurality of scan data acquisition commands. The second scan procedure includes a second plurality of scan table motion commands and a second plurality of scan data acquisition commands to acquire MR data from the feature of interest. The third scan procedure includes a third plurality of scan table motion commands and a third plurality of scan data acquisition commands to acquire MR data from the located anomaly.

In accordance with another aspect of the invention, the invention is embodied in a computer program stored on a tangible computer readable storage medium and having instructions which, when executed by a computer, cause the computer to automatically reconstruct a first survey image from magnetic resonance (MR) data acquired via an application of a first scan procedure, where the survey image represents a first region in an object. The instructions also cause the computer to identify a first feature of interest of the object in the first survey image, prescribe a first feature scan of the first feature of interest based on the first survey image, acquire MR data from the first feature of interest via application of the first feature scan, and reconstruct a first feature image based on the MR data acquired via application of the first feature scan. The instructions also cause the computer to automatically perform an image analysis of the first feature image based on the identified first feature of interest, locate an abnormality of the first feature of interest in the first feature image based on the image analysis, predict a cause of the abnormality, and display the prediction of the cause to a user.

In accordance with another aspect of the invention, a diagnostic magnetic resonance (MR) imaging method includes automatically scanning an object according to a first scanning protocol, where automatically scanning the object according to the first scanning protocol comprises acquiring MR data of the object with at least one MR coil. The method also includes automatically locating a feature of interest of the object based on the acquired MR data of the object, automatically scanning the feature of interest according to a second scanning protocol to acquire MR data of the feature of interest with at least one MR coil, automatically locating an abnormality of the feature of interest based on the acquired MR data of the feature of interest, automatically scanning the abnormality according to a third scanning protocol to generate at least one MR image of the abnormality, automatically initiating an image analysis of the at least one MR image, automatically predicting a cause of the abnormality based on the initiated image analysis, and displaying the prediction of the cause of the abnormality to a user. Automatically locating the feature of interest and the anomaly and automatically predicting the cause of the anomaly is free of user input.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings.

DETAILED DESCRIPTION

Figure 1:
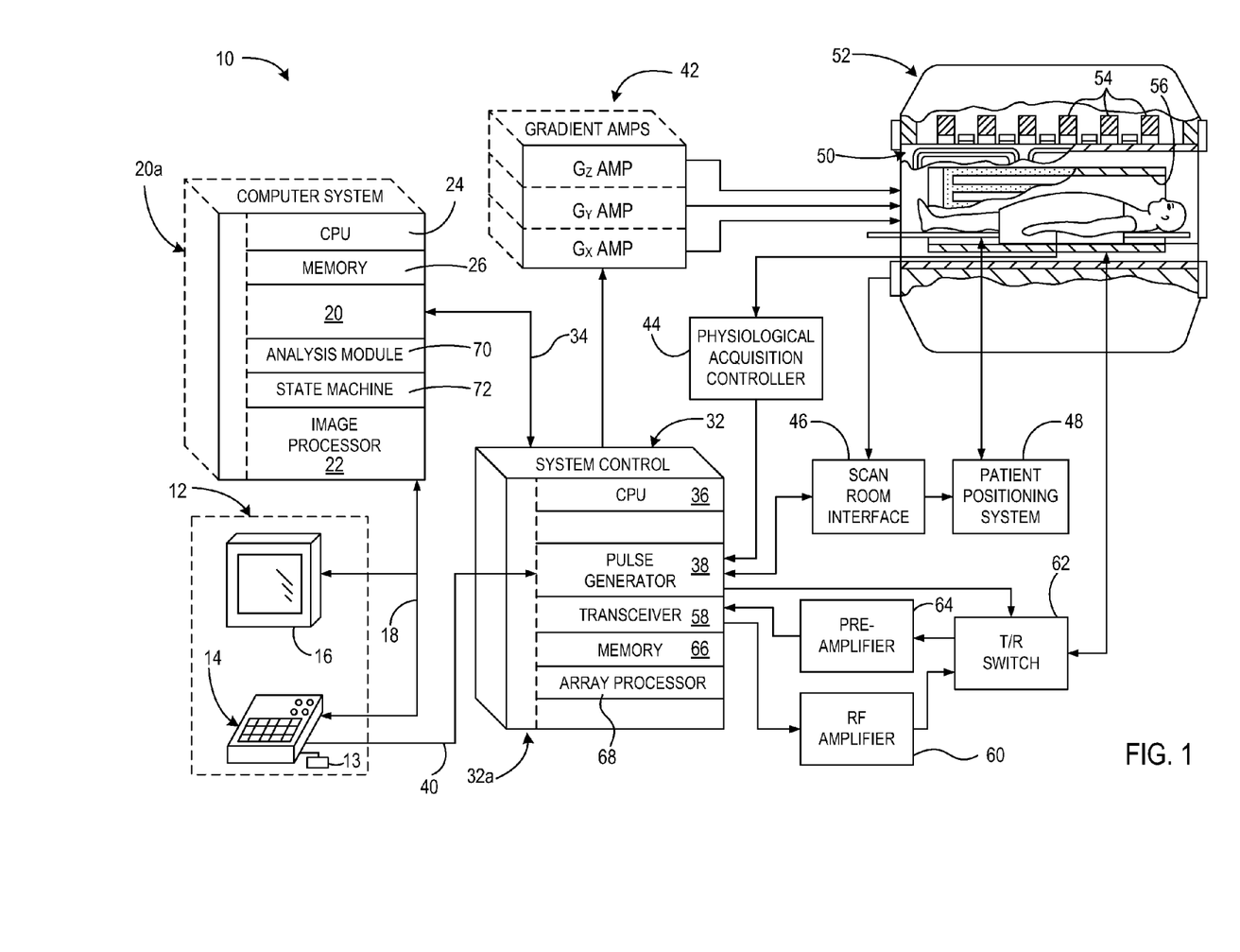
FIG. 1 is a schematic block diagram of an MR imaging system incorporating the invention.

Referring to FIG. 1, the major components of a preferred magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

According to one embodiment of the invention, computer system 20 also includes an analysis module 70 and a state machine 72. While analysis module 70 and state machine 72 are illustrated as separate components, it is contemplated that a single component may be configured to perform embodiments of the invention as described herein. Analysis module 70 is configured to analyze images processed by the image processor 22 to identify landmarks, calculate scan planes, or quantify tissue function, as examples. State machine 72, in one embodiment, is configured to keep track of the current imaging state and to transition into a next imaging state or to begin terminating scanning based on an input from analysis module 70 as will be further described below. Transitioning into the next imaging state based on automatically analyzed images includes choosing the next imaging state to further a particular study while eliminating or reducing scans that are not needed or scans that have little diagnostic value. In this manner, scanning time may be reduced, scanner operator involvement may be reduced, and patient throughput may be increased.

In one embodiment, state machine 72 may be programmed with a decision tree or a decision procedure configured to direct the scanning of a target study along one path or another based on the analysis of a recently analyzed image. Normal tissue functions or differences/anomalies thereof from expected results may lead to different clinical pathways depending on the type of results found. State machine 72, for example, may direct a next scan toward classifying a lesion if the lesion was found in the prior image or may direct the next scan toward quantifying normal tissue function if no lesion was found. Accordingly, state machine 72 may direct scanning in one manner for one patient and in another manner for another patient for the same target study depending on the analyzed images for each patient.

Figure 2:
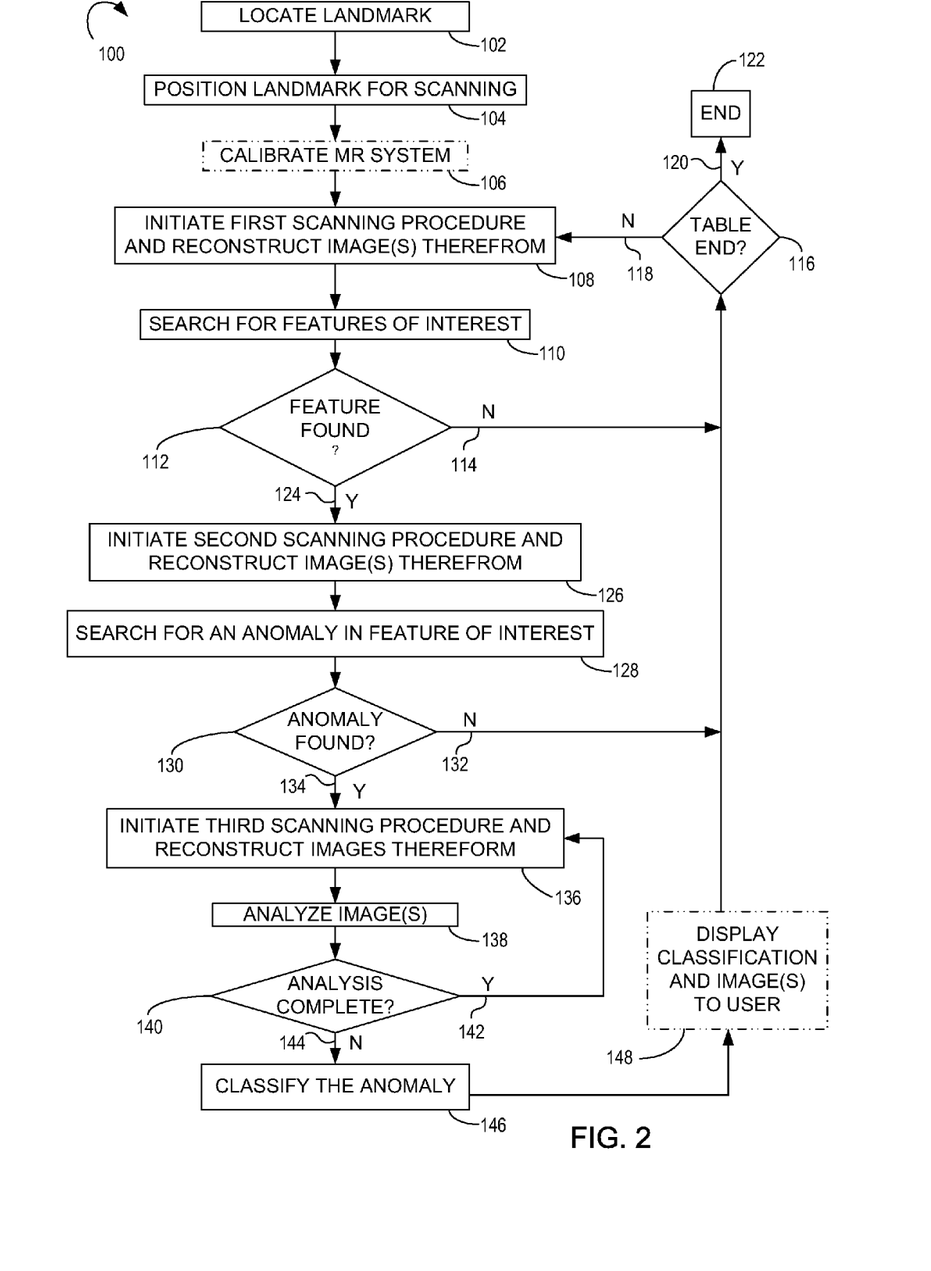
FIG. 2 is a flowchart illustrating a technique for automatically scanning and analyzing MR images according to an embodiment of the invention.

FIG. 2 is a flowchart illustrating a technique 100 for automatically scanning and analyzing images according to an embodiment of the invention. As shown and as will be discussed below, technique 100 includes automated scanning and processing of images by a computer to locate features of interest and analyze aspects thereof. Technique 100 implements various scanning protocols or procedures to determine, for example, the existence of normal and/or abnormal tissue and function. Technique 100 also reports such findings to a user or technician. Automatic assessment of images and automatic prescription of future imaging scans allows automated decision-making regarding the types of scans and image analyses required to complete an MR study.

Technique 100 begins at block 102, where one or more landmarking features of an object, such as a patient, are located. A landmarking feature is an identifiable feature of the object. For example, the landmarking feature could be the patella region of the knee, the liver or portion thereof, a sternum region of the chest, or a feature of the head or brain. Other landmarking tissues, organs, and regions are also contemplated herein. It is contemplated that the landmarking feature could be located automatically via, for example, the implementation of a scout or survey scan. For example, a scout scan could be employed, and the resulting MR images could be analyzed by a computer to locate the landmarking feature.

According to another embodiment, an optically driven identification system could be employed to identify one or more features of interests. According to yet another embodiment, a user or technician could manually identify and locate the one or more features of interests. Embodiments of the invention, however, are not limited to the automatic and manual examples listed above, other automatic or manual landmark locating implementations are contemplated.

After locating the landmarking feature, the landmarking feature is positioned for scanning at block 104. As will be discussed in detail below, technique 100 implements various scanning procedures throughout different regions of the imaging object. Technique 100 begins with a scanning and analysis of the located landmark and ends with scanning and analysis of a predetermined end point or region. As such, the imaging table on which the object is positioned will progress in such a manner that allows a scanning of the located landmark, the predetermined end point or region, and regions therebetween. For example, in one embodiment, it may be predetermined that technique 100 will begin with a scanning and analysis of a subject's patella and end with a scanning and analysis of the subject's brain. Accordingly, through the implementation of technique 100, the imaging table will progress in such a manner to allows for the MR device to image the patella (a landmark feature) and regions up to an including the brain (an end point or region).

At block 106 (shown in phantom), it is contemplated that the MR system employing technique 100 may implement an automatic calibration protocol. It is envisioned that the automatic protocol implements a transmitted gain scheme that employs, for example, a fast $B_1$ calibration scheme, such as the Bloch-Siegert approach or similar fast algorithm. The automatic calibration protocol sets RF pulses, which will later be applied, to correct amplitudes that are dependent on the magnetic properties of the portion of the object to be imaged. For example, if a large region, such as the whole-body, is to be scanned, the calibration protocol may include determination of the RF pulse amplitudes for sub-regions of the whole-body. The RF pulse amplitudes are adjusted accordingly during later scanning as the table is traversed and the regions (i.e., sub-regions) are brought into the imaging volume. In other words, the automatic calibration protocol determines RF pulse amplitudes for RF pulses that will be applied to the landmark feature and regions up to an including the end point or region.

At block 108, a first scanning procedure or protocol is initiated to scan the landmark feature, and one or more images are reconstructed therefrom. The first scanning procedure determines table motion parameters and data acquisition parameters of a survey or scout scan. Table motion parameters include commands that cause the imaging table to move in a step-wise or continuous manner and the data acquisition parameters include commands that cause the MR device to scan the object according to a data acquisition procedure. The data acquisition parameters may, for example, include flip angle parameters, repetition time parameters, image field-of-view, spatial resolution, or the like. Accordingly, upon initiation of the first scanning procedure, the MR device begins to scan the object according to the acquisition parameters and the table motion parameters. Depending on the table motion parameters of the first scanning procedure, the MR device may acquire MR data from the object as the table is moving, or the MR device may acquire MR data from the object as the table is stationary or temporarily stationary. One or more images are then reconstructed from the acquired MR data.

It is noted that, if the calibration protocol is implemented at block 106, it is contemplated that RF pulses applied during the first scanning procedure are set to the RF pulse amplitude(s) determined during the calibration protocol.

Alternatively, if the calibration protocol is not implemented at block 106, and calibration is desired, it is contemplated that the first scanning procedure implements a calibration protocol for the region to be scanned. Accordingly, each time the first scanning procedure is implemented at block 108, a calibration protocol is implemented to determine proper RF pulse amplitudes. Accordingly, RF pulse magnitudes are updated prior to scanning each new region.

After one or more images are reconstructed, the MR device implements a search protocol at block 110 and searches the one or more images for one or more features of interest. The search protocol includes a set of commands that cause a computer of the MR device to analyze the one or more reconstructed images and search for particular features of interest. For example, the search commands may cause the computer to search for image data representing features such as knee cartilage, the liver, portions of the abdomen, portions of the cardiac region, and/or regions of the brain. It is contemplated that the search protocol implements one or more algorithms to aid in the analysis of the image data to identify or locate the one or more features of interests. It is noted that the search protocol may cause the computer to search for any identifiable features of interest.

At block 112, it is determined whether or not a feature of interest has been identified or located. If the feature of interest has not been located 114, it is determined at block 116 if table motion is complete. In other words, it is determined whether or not the end point or region (e.g., a region of the brain) of the object has been scanned. The end point or region may either be input by a user or technician or it may be a predetermined endpoint or region discoverable using technique 100.

If it is determined that table motion is not complete 118, data acquisition continues at block 108, and one or more additional images are acquired and reconstructed. It is contemplated that data acquisition for locating a feature of interest occurs as the imaging table is in motion, thus causing the MR device to image a different region of the object than the region imaged in the previous iteration.

Alternatively, it is contemplated that the first scanning procedure may cause the imaging table to advance in a step-wise or incremental manner between data acquisitions. In such an embodiment, a region different than the region imaged in the previous iteration is imaged. However, rather than acquiring data as the table is moving, data acquisition occurs while the table is stationary.

Referring again to block 116, if it is determined that table motion is complete 120 (i.e., the end point or region of the object has been scanned), technique 100 ends at block 122.

Referring back to block 112, if it is determined that a feature of interest (e.g., the liver), is found 124, a second scanning procedure for imaging the located feature is initiated at block 126, and one or more images are reconstructed therefrom. It is contemplated that the second scanning procedure is a feature-specific scanning protocol that includes data acquisition parameters and table motion parameters tailored to the identified feature of interest. For example, the second scanning procedure may include data acquisition commands and table motion commands that are specific to the liver region. As such, a computer chooses or prescribes a particular feature-specific scanning protocol based on the feature of interest that is identified or found. Thus, the type of scan can be automatically tailored to the (identified) anatomy in the imaging field-of-view (FOV).

The second scanning procedure causes the MR device to acquire or elicit MR data from the identified feature according to predetermined data acquisition parameters and table motion parameters and reconstruct one or more images therefrom.

Once the one or more images are reconstructed, the computer analyzes the one or images at block 128 to search for an anomaly or another aspect of the feature. For example, the computer may be caused to search for liver lesions, tumors, or other anomalies or abnormalities of the liver. The analysis may include automatically localizing the feature of interest, identifying the feature of interest, and performing a quantification that is specific to the feature of interest. It is contemplated that one or more algorithms may be implemented to aid in the search for the anomalies of the feature of interest.

At block 130, it is determined via the computer (e.g., state machine 72 of FIG. 1) whether an anomaly of the feature of interest has been found. If it is determined that an anomaly is not found 132, a determination is made at block 116 as to whether or not the table motion is complete. If it is determined that a table stop or ending point has been reached 120, technique 100 proceeds to end at block 122.

On the other hand, if it is determined that the end point of the imaging table has not been reached 118, the first scanning procedure is again initiated at block 108 to identify another region of interest as described above.

Referring back to block 130, if an anomaly of the feature is located 134, the anomaly is scanned via a third scanning procedure at block 136, and one or more images are reconstructed therefrom. A computer of the MR system (e.g., computer system 20 of FIG. 1) prescribes the third scanning procedure, which may be based on the image(s) reconstructed from the second scanning procedure. It is contemplated that the third scanning procedure may acquire MR data for MR images of a higher resolution than the images reconstructed from the first and/or second scanning procedure data. In addition, or alternatively, it is contemplated that the third scanning procedure may have unique characteristics that make it specially adapted to scanning anomalies of the particular feature of interest. As with the first and second scanning procedures, it is contemplated that the third scanning procedure includes data acquisition commands and table motion commands.

At block 138, the one or more images are analyzed to identify the anomaly. It is contemplated that the analysis could include quantification and/or other image analysis techniques. This quantification and/or other image analysis may occur independently of whether an anomaly has been detected. In addition, it is contemplated that the quantification or image analysis is specific to the region of the anatomy analyzed. For example, in a whole-body screening, when a region of the heart is encountered, a short axis scan plane cine scan followed by an image analysis routine that computes the heart's ejection fraction may be initiated. At block 140, it is determined whether or not further analysis is needed. If it is determined that further analysis is needed 142 to, for example, diagnose or classify the anomaly, the third scanning procedure is again initiated at block 136 and further image(s) are reconstructed therefrom. Alternatively, or in addition thereto, it is contemplated that the third scanning procedure having different data acquisition commands and/or table motion commands is again initiated to scan a different region of the anomaly. Accordingly, one or more images of the different region would be reconstructed.

If it is determined that no further analysis is needed 144, technique 100 predicts the underlying cause of the anomaly, or at least classifies the anomaly, at block 146. For example, an anomaly found in the liver may be analyzed to determine or predict that the anomaly is a liver tumor (e.g., hepatoma) or a biliary atresian. The prediction and one or more images of the diseased region may be then displayed to a user or technician at block 148 (shown in phantom). It is contemplated the prediction and the image(s) could be displayed at a later time. For example, the prediction and the image(s) could be displayed when technique 100 is ended at 122. It is noted that the detection of an anomaly may also lead to particular image(s) being flagged for further specific review by a doctor.

Regardless of when the prediction and the one or more images are displayed, it is again determined if table motion is complete at block 116. If table motion is complete 120, technique 100 ends at 122. On the other hand, if it is determined that table motion is not complete 118, the first scan (e.g., a survey scan) is again initiated at block 108 at a different region of the object.

Figure 3:
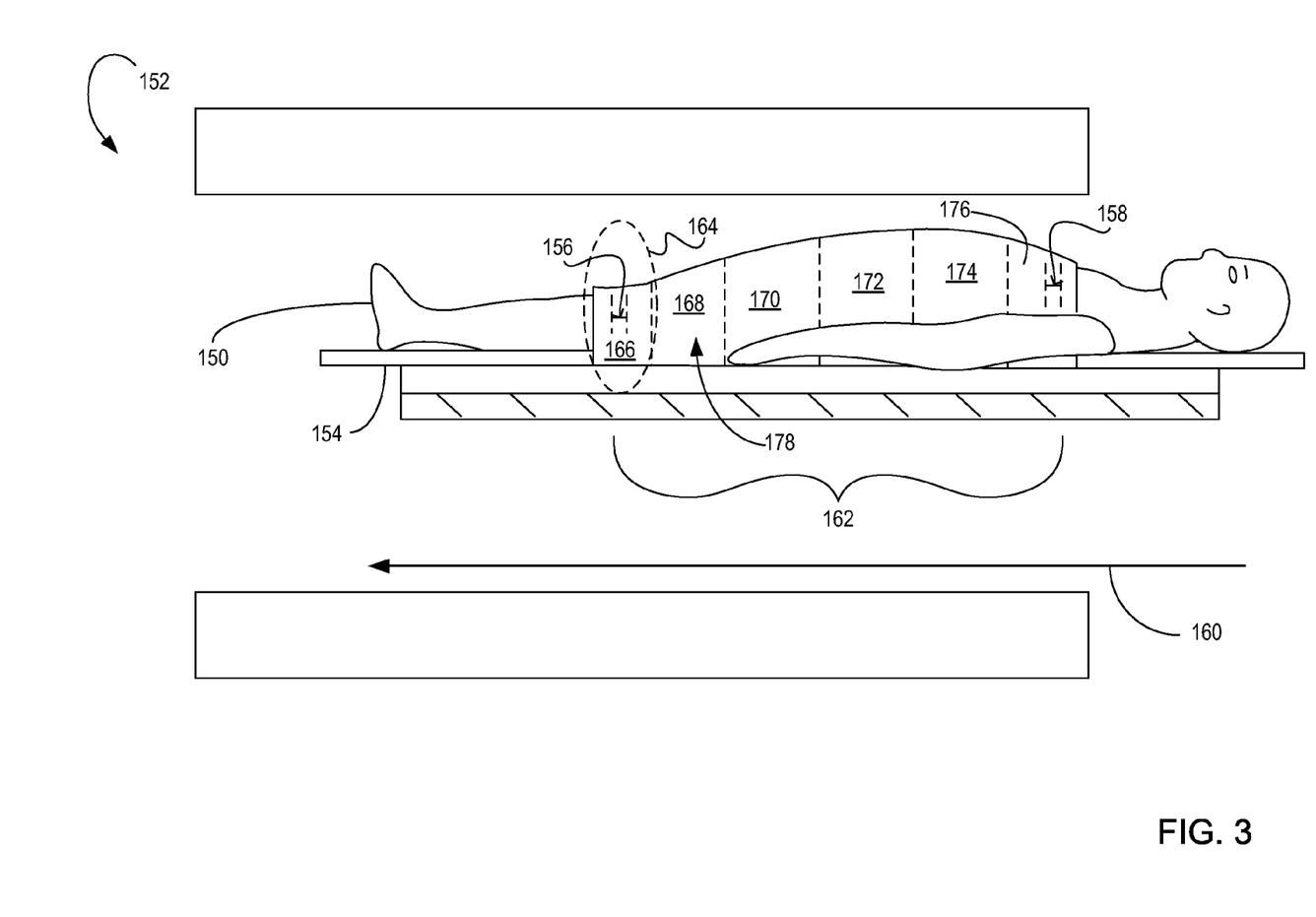
FIG. 3 is a diagram showing an implementation of the technique of FIG. 2 according to an embodiment of the invention.

Referring now to FIG. 3, a depiction of a subject 150 in a portion of an MR device 152 implementing technique 100 of FIG. 2 is shown according to an embodiment of the invention. FIG. 3 depicts subject 150 on a positioning table 154 (i.e., a movable MR imaging table) of MR device 152. A landmark region 156 on subject 150 represents a landmarking region where the survey scan begins, and an end region 158 on subject 150 represents the last region of subject 150 to be scanned. Positioning table 154 moves in a table direction 160 as a plurality of successive regions 162, from landmark region 156 to end region 158, are scanned by the MR device 152. Imaging of subject 150 may occur as subject 150 is moving through a "sweet spot" 164 of MR device 152. Sweet spot 164 is considered a region of MR device 152 where magnetic field inhomogeneities are at a minimum or at least minimized.

Imaging of subject 150 may occur as positioning table 154 is stationary. If imaging is to occur as subject 150 is stationary, positioning table 154 would move in a step-wise or incremental manner such that table 154 and subject 150 would move between MR data acquisitions, rather than during acquisitions.

It is noted that landmark region 156 and end region 158 are merely exemplary. It is contemplated that other regions could be chosen. Further, it is also noted that table direction 160 is also exemplary. For example, scanning could begin with region 158 and end with landmark region 156. As such, positioning table 154 would move in a direction opposite direction 160.

Though not required, it is contemplated that a plurality of surface coil arrays 166-176 be employed during the scanning of successive regions 162 of subject 150. For example, as landmark region 156 is scanned, surface coil array 166 would be energized or activated as surface coil arrays 168-176 remain inactive or deactivated. Similarly, surface coil array 168 would be energized as a second region 178 were scanned, while remaining surface coil arrays 166, 170-176 remain inactive. Accordingly, as table 154 moves in table direction 160, thus placing successive regions 162 in sweet spot 164, successive regions 162 of subject 150 are scanned and respective surface coil arrays (i.e., surface coils 166, 168, 170, 172, 174, or 176) are energized during the scanning.

The above-described methods can be embodied in the form of computer program code containing instructions embodied in one or more tangible computer readable storage media, such as floppy diskettes and other magnetic storage media, CD ROMs and other optical storage media, flash memory and other solid-state storage devices, hard drives, or any other computer-readable storage medium, wherein, when the computer program code is loaded into and executed by a computer, the computer becomes an apparatus for practicing the disclosed method. Such media are generally non-transitory.

A technical contribution for the disclosed method and apparatus is a computer implementation that provides for automatic MR image scanning and analysis.

According to an embodiment of the invention, an MRI apparatus includes an MRI system having a plurality of gradient coils positioned about a bore of a magnet to impress a polarizing magnetic field. The MR apparatus also includes an RF transceiver system and an RF switch controlled by a pulse module to transmit and receive RF signals to and from an RF coil assembly to acquire MR images. The MRI apparatus also includes a computer programmed to initiate a first scan procedure to acquire MR data from an object and locate a feature of interest of the object, initiate a second scan procedure different than the first scan procedure when a feature of interest of the object is located, and determine if an anomaly of the feature of interest exists. If the anomaly exists, the computer is programmed to initiate a third scan procedure different than the first and second scan procedures to scan the anomaly, and reconstruct an image of the located anomaly. The first scan procedure includes a first plurality of scan table motion commands, and a first plurality of scan data acquisition commands. The second scan procedure includes a second plurality of scan table motion commands, and a second plurality of scan data acquisition commands to acquire MR data from the feature of interest. The third scan procedure includes a third plurality of scan table motion commands, and a third plurality of scan data acquisition commands to acquire MR data from the located anomaly.

According to another embodiment of the invention, the invention is embodied in a computer program stored on a computer readable storage medium and having instructions which, when executed by a computer, cause the computer to automatically reconstruct a first survey image that from magnetic resonance (MR) data acquired via an application of a first scan procedure, where the survey image represents a first region in an object. The instructions also cause the computer to identify a first feature of interest of the object in the first survey image, prescribe a first feature scan of the first feature of interest based on the first survey image, acquire MR data from the first feature of interest via application of the first feature scan, and reconstruct a first feature image based on the MR data acquired via application of the first feature scan. The instructions also cause the computer to automatically perform an image analysis of the first feature image based on the identified first feature of interest, locate an abnormality of the first feature of interest in the first feature image based on the image analysis, predict a cause of the abnormality, and display the prediction of the cause to a user.

According to another embodiment of the invention, a diagnostic magnetic resonance (MR) imaging method includes automatically scanning an object according to a first scanning protocol, where automatically scanning the object according to the first scanning protocol comprises acquiring MR data of the object with at least one MR coil. The method also includes automatically locating a feature of interest of the object based on the acquired MR data of the object, automatically scanning the feature of interest according to a second scanning protocol to acquire MR data of the feature of interest with at least one MR coil, automatically locating an abnormality of the feature of interest based on the acquired MR data of the feature of interest, automatically scanning the abnormality according to a third scanning protocol to generate at least one MR image of the abnormality, automatically initiating an image analysis of the at least one MR image, automatically predicting a cause of the abnormality based on the initiated image analysis, and displaying the prediction of the cause of the abnormality to a user. Automatically locating the feature of interest and the anomaly and automatically predicting the cause of the anomaly is free of a user input.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. An magnetic resonance imaging (MRI) apparatus comprising:
    an MR system having a plurality of gradient coils positioned about a bore of a magnet, and an radio-frequency (RF) transceiver system and an RF switch controlled by a pulse module to transmit RF signals to an RF coil assembly to acquire MR images; and
    a computer programmed to automatically:
        (A) initiate a first scan procedure to acquire MR data from an object and locate a feature of interest of the object, wherein the first scan procedure comprises:
            a first plurality of scan table motion commands; and
            a first plurality of scan data acquisition commands;
        (B) initiate a second scan procedure different than the first scan procedure, wherein the second scan procedure comprises:
            a second plurality of scan table motion commands; and
            a second plurality of scan data acquisition commands to acquire MR data from the feature of interest;
        (C) determine an anomaly of the feature of interest;
        (D) initiate a third scan procedure different than the first and second scan procedures to scan the anomaly, wherein the third scan procedure comprises:
            a third plurality of scan table motion commands; and a third plurality of scan data acquisition commands to acquire MR data from the located anomaly; and (E) reconstruct an image of the located anomaly.

2. The MRI apparatus of apparatus of claim 1 wherein the RF coil assembly comprises a plurality of surface coil arrays; and wherein the computer is further programmed to activate one surface coil array of the plurality of surface coils during at least one of the first, second, and third scan procedures while leaving a remainder of the surface coil arrays deactivated, and wherein the activation of the one surface coil array is based on a portion of anatomy of the object in an imaging field of view of the MR apparatus.

3. The MRI apparatus of apparatus of claim 1 wherein the computer is further programmed to repeat steps (A)-(E) at different regions in the object.

4. The MRI apparatus of claim 1 wherein the computer is further programmed to automatically predict a cause of the anomaly based on the image of the anomaly.

5. The MRI apparatus of claim 4 wherein the computer is further programmed to automatically repeat (D) and (E) to reconstruct an additional image of the anomaly prior to the automatic prediction of the cause of the anomaly.

6. The MRI apparatus of claim 1 wherein the third plurality of scan table motion commands are different than the second plurality of scan table motion commands.

7. The MRI apparatus of claim 1 wherein the first, second, and third pluralities of scan table motion commands cause an imaging table to move in a step-wise incremental manner.

8. The MRI apparatus of claim 1 wherein the first, second, and third pluralities of scan table motion commands cause an imaging table to move in a continuous manner during the first, second, and third pluralities of scan procedures such that MR data is acquired as the imaging table is in motion.

9. The MRI apparatus of claim 1 wherein the computer is further programmed to automatically:

reconstruct a first scan image based on the MR data acquired during the first scan procedure;

analyze the first scan image to identify the feature of interest;

reconstruct a second scan image based on the MR data acquired from the feature of interest during the second scan procedure;

analyze the second scan image to determine whether the feature of interest includes an anomaly, wherein the analysis of the second scan image is based on the identified feature of interest; and provide diagnostic information based on the analysis of the second scan image to a technician.

10. The MRI apparatus of claim 1 wherein the computer is further programmed to:

automatically locate a landmark feature of the object prior to initiation of the first scan procedure; and wherein (A) comprises initiation of the first scan procedure to acquire MR data comprising the landmark feature from the object.

11. The MRI apparatus of claim 1 wherein the computer is further programmed to calibrate the MRI system to determine an RF pulse amplitude of at least one command of the first plurality of scan data acquisition commands.

12. A non-transitory computer readable storage medium having stored thereon a computer program comprising instructions, which, when executed by a computer, cause the computer to automatically:

reconstruct a first survey image from magnetic resonance (MR) data acquired via an application of a first scan procedure, wherein the first survey image represents a first region in an object;

identify a first feature of interest of the object in the first survey image;

prescribe a first feature scan of the first feature of interest based on the first survey image;

acquire MR data from the first feature of interest via application of the first feature scan;

reconstruct a first feature image based on the MR data acquired via application of the first feature scan;

perform an image analysis of the first feature image, wherein the image analysis is based on the identified first feature of interest;

locate an abnormality of the first feature of interest in the first feature image based on the image analysis;

reconstruct a second survey image from MR data acquired via an additional application of the first scan procedure, wherein the second survey image represents a second region in the object;

identify a second feature of interest of the object in the second survey image;

prescribe a second feature scan of the second feature of interest based on the second survey image;

acquire MR data from the second feature of interest via application of the second feature scan;

reconstruct a second feature image based on the MR data acquired via application of the second feature scan;

perform an image analysis of the second feature image, wherein the image analysis of the second feature image is based on the identified second feature of interest;

display diagnostic information to the user based on the image analysis of the second feature of interest;

scan the abnormality according to a third scanning protocol, different than the first and second scanning protocols to generate at least one MR image of the abnormality;

initiate an image analysis of the at least one MR image, wherein the image analysis is based on the feature of interest;

predict a cause of the abnormality; and display the prediction of the cause to a user.

13. The computer readable storage of claim 12 wherein the instructions further cause the computer to automatically:

prescribe a first abnormality scan of the abnormality based on the image analysis of the first feature image; and reconstruct an abnormality image of the abnormality based on the abnormality scan, wherein prediction of the cause of the abnormality is based on the abnormality image.

14. The computer readable storage medium of claim 12 wherein the instructions further cause the computer to automatically acquire the MR data via the application of the first scan procedure as the object is moving.

15. The computer readable storage medium of claim 12 wherein the instructions further cause the computer to automatically:

locate an abnormality of the second feature of interest in the second feature image;

predict a cause of the abnormality of the second feature of interest; and display the prediction of the cause of the abnormality of the second feature of interest to the user.

16. The computer readable storage medium of claim 12 wherein the first scan procedure comprises instructions, which, when executed by a computer, cause the computer to automatically calibrate an MR system to determine a radio-frequency (RF) pulse amplitude, and wherein an RF pulse having the RF pulse amplitude is applied to the object during the application of the first scan procedure.

17. The computer readable storage medium of claim 12 wherein the instructions further cause the computer to automatically:
calibrate an MR system prior to the application of the first scan procedure to determine a radio-frequency (RF) pulse amplitude; and
apply an RF pulse having the RF pulse amplitude to the object during the application of the first scan procedure.

18. A diagnostic magnetic resonance (MR) imaging method comprising:
automatically scanning an object with a magnetic resonance imaging (MRI) device according to a first scanning protocol, wherein automatically scanning the object according to the first scanning protocol comprises acquiring MR data of the object with at least one MR coil;
automatically locating a feature of interest of the object based on the acquired MR data of the object, wherein automatically locating the feature of interest is free of a user input;
automatically scanning the feature of interest with the MRI device according to a second scanning protocol, different than the first scanning protocol to acquire MR data of the feature of interest with at least one MR coil;
automatically locating an abnormality of the feature of interest based on the acquired MR data of the feature of interest, wherein automatically locating the abnormality is free of a user input;
automatically scanning the abnormality with the MRI device according to a third scanning protocol, different than the first and second scanning protocols to generate at least one MR image of the abnormality;
automatically initiating an image analysis of the at least one MR image, wherein the image analysis is based on the feature of interest;
automatically predicting a cause of the abnormality based on the initiated image analysis, wherein automatically predicting the cause is free of a user input; and
displaying on a display device the prediction of the cause of the abnormality to a user.

19. The method claim 18 further comprising:
automatically optically identifying a landmark feature of the object; and
wherein automatically scanning the object according to the first scanning protocol comprises automatically scanning the object according to the first scanning protocol at the landmark feature.

20. The method of claim 18 further comprising automatically reconstructing a feature image of the feature of interest based on the acquired MR data of the feature of interest, wherein automatically locating the abnormality of the feature of interest comprises:
automatically localizing the feature of interest;
automatically identifying the feature of interest; and
automatically performing a quantification that is specific to the feature of interest.

* * * * *